(12) United States Patent
Li et al.

(10) Patent No.: US 8,392,134 B2
(45) Date of Patent: Mar. 5, 2013

(54) ANTENNA TESTING DEVICE AND ANTENNA TESTING METHOD USING THE SAME

(75) Inventors: Zhan Li, Shenzhen (CN); Ye Xiong, Shenzhen (CN); Ge Zhang, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 492 days.

(21) Appl. No.: 12/713,267

(22) Filed: Feb. 26, 2010

(65) Prior Publication Data

US 2011/0032162 A1 Feb. 10, 2011

(30) Foreign Application Priority Data

Aug. 10, 2009 (CN) .......................... 2009 1 0305458

(51) Int. Cl.
*G01R 23/16* (2006.01)
*G01R 29/10* (2006.01)

(52) U.S. Cl. ........................ 702/76; 343/703; 455/226.1

(58) Field of Classification Search .................. None
See application file for complete search history.

(56) References Cited

U.S. PATENT DOCUMENTS

| | | | | |
|---|---|---|---|---|
| 6,088,582 A * | 7/2000 | Canora et al. | ............. | 455/226.1 |
| 6,525,620 B1 * | 2/2003 | Barabash | .................... | 333/24 C |
| 6,839,032 B2 * | 1/2005 | Teshirogi et al. | ............. | 343/702 |
| 7,068,231 B2 * | 6/2006 | Huang | ........................ | 343/703 |
| 8,103,470 B2 * | 1/2012 | Teshirogi et al. | ............... | 702/76 |
| 2006/0232491 A1 * | 10/2006 | Nakamura | .................... | 343/841 |
| 2010/0153045 A1 * | 6/2010 | Teshirogi et al. | ............... | 702/76 |

* cited by examiner

*Primary Examiner* — Trinh Dinh
(74) *Attorney, Agent, or Firm* — Altis Law Group, Inc.

(57) ABSTRACT

An antenna testing device includes an analyzer, a transmission probe electrically connected to the analyzer, a receiving probe electrically connected to the analyzer, and a shielded box having a cutoff frequency. The analyzer generates a test signal the frequency of which is lower than the cutoff frequency, the transmission probe receive the test signal and sends the test signal to the shielded box. The antenna is coupled with the transmission probe and generates a coupled signal, the receiving probe receives the coupled signal and sends the coupled signal to the analyzer. The analyzer analyzes the coupled signal and the test signal, the analyzer calculates the return loss of the antenna.

14 Claims, 3 Drawing Sheets

ANTENNA TESTING DEVICE AND ANTENNA TESTING METHOD USING THE SAME

RELATED APPLICATIONS

This application is based upon and claims the benefit of priority under 35 U.S.C. 119 from CHINA 200910305458.7 filed on Aug. 10, 2009, the content of which is incorporated herein by reference.

BACKGROUND

1. Technical Field

The present disclosure relates to an antenna testing device for improving the accuracy of antenna testing and an antenna testing method using the same.

2. Description of Related Art

Generally, portable electronic devices have antennas for receiving/sending wireless signals. The quality of the antenna has a direct impact on the communication quality of the portable electronic device. Therefore, an accurate test of the antenna is very important.

Typically, antenna testing devices include a shielded box, an analyzer, and a test board. The electromagnetic wave absorbing materials are set in the shielded box. The test board includes a transmission probe, a ground probe and a port connecting to the analyzer.

The testing process of the antenna testing device includes the following steps: An antenna is put into the shielded box. The transmission probe connects to a feed point of the antenna; the ground probe connects to a ground point of the antenna. The analyzer sends a signal to the test board, and the test board sends the signal to the antenna via the transmission probe. The antenna receives the signal and sends a return signal to the test board via the ground probe. The test board receives the return signal from the antenna and sends the return signal to the analyzer. The analyzer compares the signal with the return signal to obtain the return loss of the antenna, and then the analyzer judges whether the antenna is qualified.

However, the quality of the test board, the quality of the electromagnetic wave absorbing materials, etc. could affect the accuracy and the stability of the antenna testing device.

Therefore, there is room for improvement within the art.

BRIEF DESCRIPTION OF THE DRAWINGS

Many aspects of the present antenna testing device and antenna testing method using the same can be better understood with reference to the following drawings. The components in the various drawings are not necessarily drawn to scale, the emphasis instead being placed upon clearly illustrating the principles of the present antenna testing device and antenna testing method using the same.

DETAILED DESCRIPTION

Figure 1:
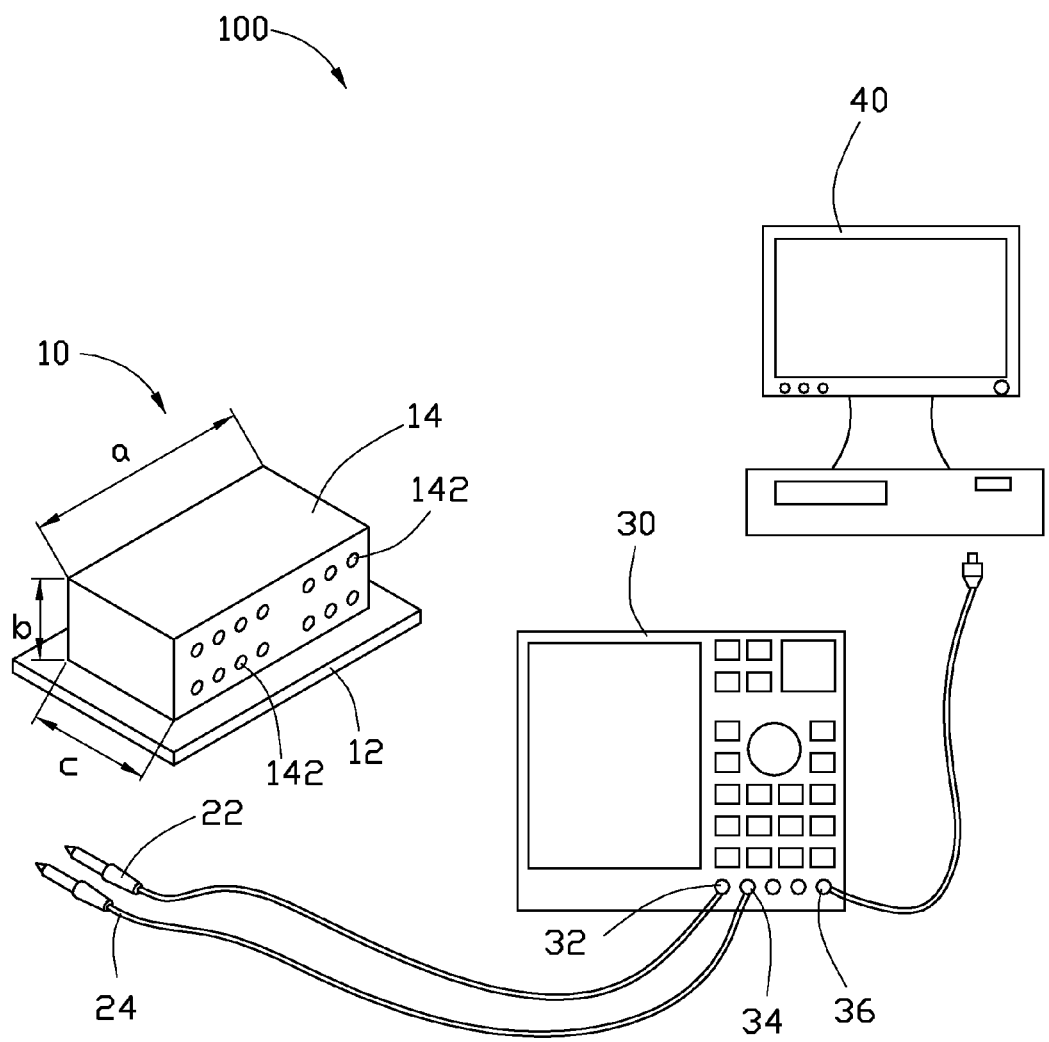
FIG. 1 is a structure diagram of an exemplary embodiment of an antenna testing device.

Referring to FIG. 1, an antenna testing device 100 according to the present disclosure includes a shielded box 10, a transmission probe 22, a receiving probe 24, an analyzer 30, and a display device 40. The shielded box 10 connects to the analyzer 30 through the transmission probe 22 and the receiving probe 24.

The shielded box 10 includes a plate 12 and a cover 14. The plate 12 is flat, and carries a standard antenna or an antenna to be tested. A receiving chamber (not shown) is located on the plate 12, and the shape of the receiving chamber corresponds with the standard antenna or the antenna to be tested. The cover 14 is a hollow rectangular container, and an opening is located on one side of the cover 14. The plate 12 is disposed on the opening of the cover 14. The cover 14 defines a plurality of locking holes 142 on one side, which is perpendicular to the plate 12.

The shielded box 10 is made of aluminum, and the specific size of the shielded box 10 is $a*b*c(mm^3)$. According to an exemplary embodiment, a may equal about 120 mm, b may equal about 30 mm, and c may equal about 50 mm. The thickness of the wall of the shielded box 10 is about 1~2(mm) The shielded box 10 is rectangular waveguide and it is equivalent to a high-pass filter having a cutoff frequency. If the frequency of the signal is lower than the cutoff frequency, the signal can not pass the shielded box 10. Generally, the highest frequency of an antenna is 3 GHz. The cutoff frequency of the shielded box 10 can be 4 GHz or more. Therefore, the electromagnetic signals transmitting in the shielded box 10 almost have no energy loss.

The transmission probe 22 and the receiving probe 24 are made of conductive materials, like copper, aluminum, etc. The analyzer 30 includes an output terminal 32, an input terminal 34 and a transmission terminal 36. The output terminal 32 is electrically connected to the transmission probe 22, and the input terminal 34 is electrically connected to the receiving probe 24. The transmission terminal 36 electrically connects to the display device 40 by a cable or wire. The display device 40 displays the data from the analyzer 30.

Figure 2:
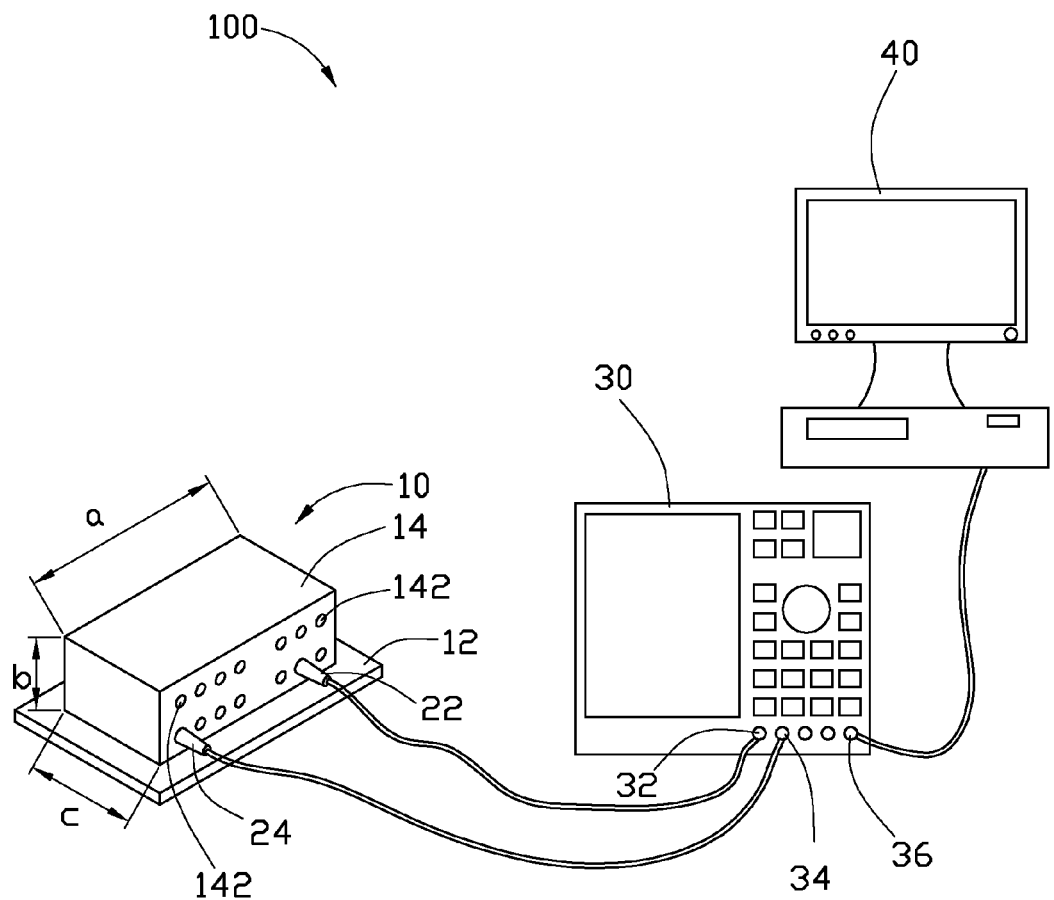
FIG. 2 is an assembled diagram of the antenna testing device shown in FIG. 1.

Referring to FIG. 2, the assembly process of the antenna testing device 100 is as follows. The transmission probe 22 is disposed in the locking hole 142. The receiving probe 24 is disposed in another locking hole 142. The distance between the transmission probe 22 and the receiving probe 24 can be adjusted by the locking holes 142 in different positions. The transmission terminal 36 is electrically connected to the display device 40 by the cable.

Figure 3:
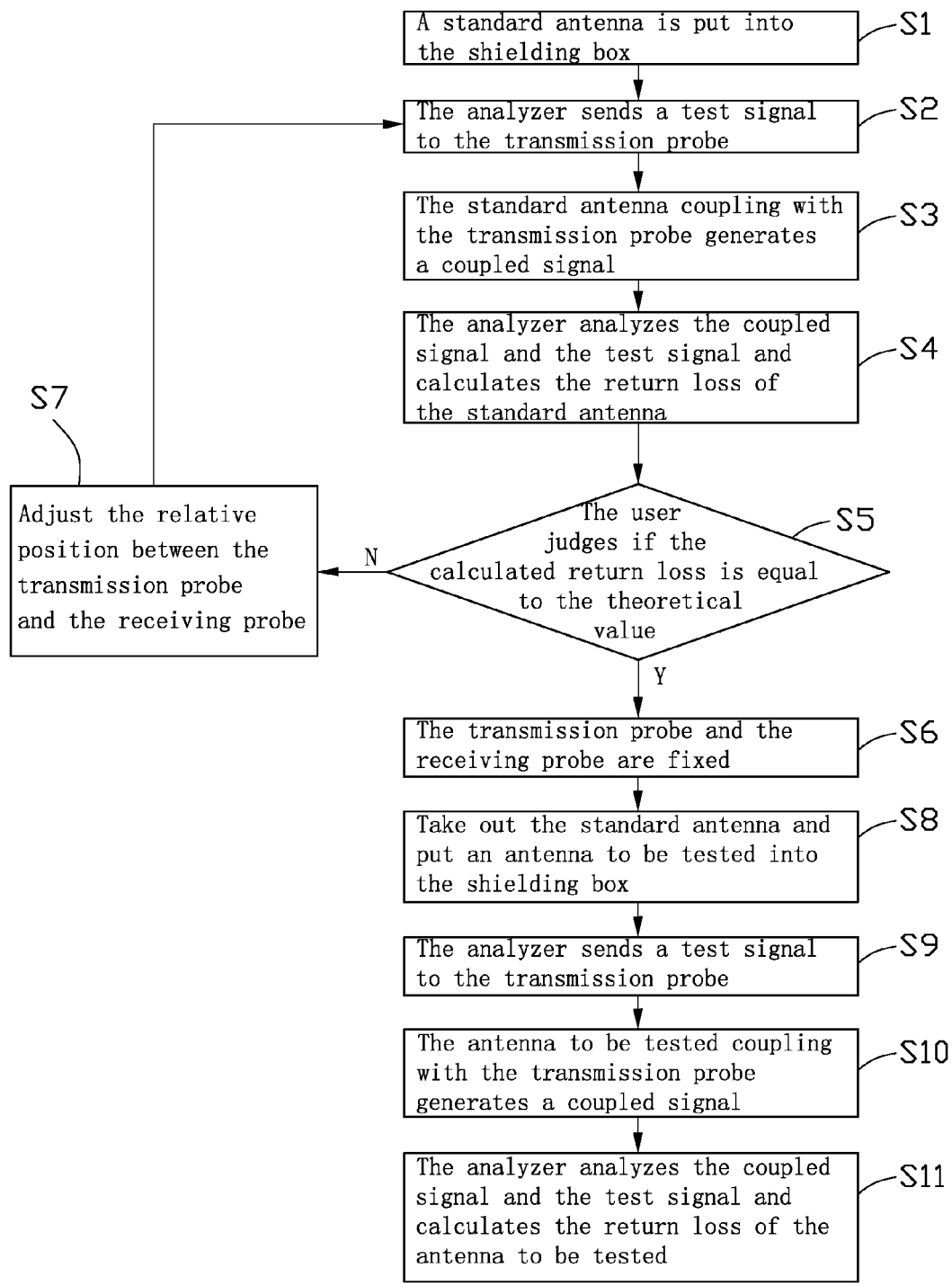
FIG. 3 is a test flow chart of the exemplary antenna testing method.

Referring to FIG. 3, the testing process of the antenna testing device 100 may include the following steps:

In step S1, a standard antenna, with standard parameters, is put into the shielded box 10. The standard antenna can be disposed in the receiving chamber of the plate 12.

In step S2, the analyzer 30 sends a test signal to the transmission probe 22.

In step S3, the standard antenna is coupled with the transmission probe 22 and the standard antenna generates a coupled signal.

In step S4, the receiving probe 24 receives the coupled signal and sends the coupled signal to the analyzer 30. The analyzer 30 analyzes the coupled signal and the test signal and calculates the return loss of the standard antenna. The analyzer 30 sends the calculated return loss to the display device 40.

In step S5, the user judges whether the calculated return loss displayed on the display device 40 is equal to the theoretical value. If the calculated return loss is equal to the theoretical value, the process goes to step S6. If the calculated return loss is not equal to the theoretical value, the process goes to step S7.

In step S6, the position of the transmission probe 22 and the receiving probe 24 is fixed, and the process goes to step S8.

In step S7, the relative distance between the transmission probe 22 and the receiving probe 24 is adjusted by the locking holes 142 in different positions, and the process goes to step S2.

In step S8, the antenna is taken out from the shielded box 10, and an antenna to be tested is put into the shielded box 10.

In step S9, the analyzer 30 sends a test signal to the transmission probe 22.

In step S10, the antenna to be tested is coupled with the transmission probe 22 and the antenna to be tested generates a coupled signal.

In step S11, the receiving probe 24 receives the coupled signal and sends the coupled signal to the analyzer 30. The analyzer 30 analyzes the coupled signal and the test signal and calculates the return loss of the antenna to be tested. The calculated return loss is compared with the theoretical value, and the result of the comparison is sent to the display device 40.

As detailed above, the test board and the electromagnetic wave absorbing materials are omitted in the antenna testing device 100, the cost is reduced. As the factors affecting the test result decrease, the accuracy of the antenna testing device is improved.

It is to be further understood that even though numerous characteristics and advantages of the present embodiments have been set forth in the foregoing description, together with details of structures and functions of various embodiments. The disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. An antenna testing device, comprising:
an analyzer;
a transmission probe electrically connected to the analyzer;
a receiving probe electrically connected to the analyzer; and
a shielded box having a cutoff frequency;
wherein the analyzer generates a test signal the frequency of which is lower than the cutoff frequency, the transmission probe receives the test signal and sends the test signal to the shielded box; an antenna located in the shielded box is coupled with the transmission probe and generates a coupled signal, the receiving probe receives the coupled signal and sends the coupled signal to the analyzer; the analyzer analyzes the coupled signal and the test signal and calculates a return loss of the antenna.

2. The antenna testing device as claimed in claim 1, wherein the shielded box is a rectangular waveguide.

3. The antenna testing device as claimed in claim 2, wherein the shielded box includes a plate and a cover disposed on the plate.

4. The antenna testing device as claimed in claim 3, wherein a receiving chamber is located on the plate, and the shape of the receiving chamber corresponds to the antenna.

5. The antenna testing device as claimed in claim 3, wherein there are locking holes on the side of the cover perpendicular to the plate.

6. The antenna testing device as claimed in claim 5, wherein the analyzer includes an output terminal and an input terminal, the output terminal is electrically connected to the transmission probe; the input terminal is electrically connected to the receiving probe.

7. The antenna testing device as claimed in claim 6, wherein the transmission probe is disposed in one locking hole; the receiving probe is disposed in another locking hole.

8. The antenna testing device as claimed in claim 7, further comprising a display device, wherein the analyzer further includes a transmission terminal electrically connecting to the display device.

9. The antenna testing device as claimed in claim 1, wherein the cutoff frequency is about 4 GHz.

10. An antenna testing method comprising:
providing an antenna testing device including a transmission probe, and a shielded box having a cutoff frequency;
putting an antenna to be tested into the shielded box;
sending a test signal to the transmission probe;
generating an coupled signal through a coupling effect between the transmission probe and the antenna to be tested;
receiving the coupled signal and sending the coupled signal to an analyzer through a receiving probe;
calculating a return loss of the antenna to be tested through an analysis result of the test signal and the coupled signal;
determining whether the antenna to be tested is qualified through the comparison between the calculated return loss and a theoretical value, and the theoretical value for the antenna to be tested is a loss value of signal power resulting from the reflection caused at a discontinuity in a transmission line.

11. The antenna testing method as claimed in claim 10, further comprising pre-adjusting the antenna testing device, the pre-adjustment process of the antenna testing device comprising:
providing the receiving probe;
putting a standard antenna with the theoretical value into the shielded box;
sending the pre-adjusting test signal to the transmission probe;
generating the pre-adjusting coupled signal through a coupling effect between the transmission probe and the standard antenna;
calculating the return loss of the standard antenna through the pre-adjusting analysis result of the pre-adjusting test signal and the pre-adjusting coupled signal;
determining if the pre-adjusting calculated return loss is equal to the theoretical value, fixing the position of the transmission probe and the receiving probe, and taking out the standard antenna from the shielded box;
if the calculated return loss is not equal to the theoretical value, adjusting the distance between the transmission probe and the receiving probe until the calculated return loss is equal to the theoretical value.

12. The antenna testing method as claimed in claim 11, wherein the shielded box is a rectangular waveguide.

13. The antenna testing method as claimed in claim 11, wherein the cutoff frequency is about 4 GHz.

14. The antenna testing method as claimed in claim 11, wherein the transmission probe and the receiving probe are both electrically connected to the analyzer.

* * * * *